United States Patent
Avanzino et al.

(10) Patent No.: US 6,265,273 B1
(45) Date of Patent: Jul. 24, 2001

(54) METHOD OF FORMING RECTANGULAR SHAPED SPACERS

(75) Inventors: Steven C. Avanzino; Stephen Keetai Park, both of Cupertino; Bharath Rangarajan, Santa Clara; Jeffrey A. Shields, Sunnyvale; Larry Yu Wang, San Jose; Guarionex Morales, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/359,502

(22) Filed: Jul. 23, 1999

(51) Int. Cl.$^7$ .................... H01L 21/336; H01L 21/3205; H01L 21/4763
(52) U.S. Cl. .................... 438/304; 438/592; 438/596
(58) Field of Search ................................ 438/303, 304, 438/596, 592

(56) References Cited

U.S. PATENT DOCUMENTS

| | | | | |
|---|---|---|---|---|
| 5,102,815 | * | 4/1992 | Sanchez | 437/44 |
| 5,688,704 | * | 11/1997 | Liu | 437/41 |
| 6,010,954 | * | 1/2000 | Ho et al. | 438/596 |

* cited by examiner

Primary Examiner—John F. Niebling
Assistant Examiner—Walter L. Lindsay, Jr.
(74) Attorney, Agent, or Firm—Foley & Lardner

(57) ABSTRACT

A method of forming spacers in an integrated circuit is disclosed herein. The method includes providing a gate structure over a semiconductor substrate, depositing a spacer material adjacent lateral sides of the gate structure, and etching the spacer material to form spacers. The spacers have minimal surface area exposed to direct sputter.

20 Claims, 8 Drawing Sheets

METHOD OF FORMING RECTANGULAR SHAPED SPACERS

FIELD OF THE INVENTION

The present invention relates to integrated circuits and to methods of manufacturing integrated circuits. More particularly, the present invention relates to a method of forming rectangular shaped spacers in an integrated circuit.

BACKGROUND OF THE INVENTION

Transistors are generally formed on the top surface of a semiconductor substrate. Typically, the semiconductor substrate is divided into a number of active and isolation regions through an isolation process, such as field oxidation or shallow trench isolation. A thin oxide is grown on an upper surface of the semiconductor substrate in the active regions. The thin oxide serves as the gate oxide for subsequently formed transistors.

Polysilicon gate conductors are formed in the active regions above the thin oxide. The gate conductor and thin oxide form a gate structure which traverses each active region, effectively dividing the active region into two regions referred to as a source region and a drain region. After formation of the polysilicon gates, an implant is performed to introduce an impurity distribution into the source/drain regions. Generally, source/drain regions are heavily doped with n-type or p-type dopants.

Often a source extension and drain extension are disposed partially underneath the gate structure to enhance transistor performance. Source and drain extensions are extensions of the source and drain regions. Shallow source and drain extensions help to achieve immunity to short-channel effects which degrade transistor performance for both n-channel and p-channel transistors. Short-channel effects can cause threshold voltage roll-off and drain-inducted barrier-lowering.

Spacers are structures which abut lateral sides of the gate structure and are provided over source and drain extensions. Preferably, spacers are silicon dioxide ($SiO_2$) structures. Alternatively, other spacer materials, such as, silicon nitride ($Si_3N_4$), silicon oxynitride (SiON), or other insulators can be used. Conventional spacer formation tends to have a rounded shape in cross-section. The rounded shape of conventional spacers results in the redeposition of spacer materials during sputter processes. Spacer materials can be redeposited on nearby portions of the silicon substrate during sputter processes. For example, during sputtering of cobalt for cobalt film deposition, spacer materials are redeposited onto the nearby substrate. Redeposited spacer materials impede $CoSi_2$ formation. $CoSi_2$ provides increased performance due to reduced silicon resistance associated with contacts.

FIGS. 1–4 illustrate how conventional shaped spacers impede $CoSi_2$ formation in the integrated circuit fabrication process. FIG. 1 illustrates a portion 10 of an integrated circuit including a substrate 12, a gate structure 14, and conventional shaped spacers 16.

Substrate 12 is any of a variety of semiconductor materials. Gate structure 14 is aligned between active regions in substrate 12. Gate structure 14 operates as an electrical switch for a stream of electrical charges, or "current," to pass from one active region to another. Active regions are areas in portion 10 including impurities or dopants such as a p-type dopant (e.g., boron) or an n-type dopant (e.g., phosphorous). Conventional shaped shapers 16 are typically rounded and are made of insulating materials.

FIG. 2 illustrates a sputtering step in the integrated circuit fabrication process for cobalt film deposition. The rounded shape of spacers 16 results in the redeposition of spacer materials onto substrate 12 during the sputtering step. The redeposition of spacer materials over substrate 12 is not necessarily uniform over substrate 12.

FIG. 3 illustrates a cobalt layer 18, which is the result of the sputtering step. Layer 18 is deposited over substrate 12, gate structure 14, and conventional shaped spacers 16. FIG. 4 illustrates the resulting spotty formation of $CoSi_2$ due to redeposition of spacer materials over substrate 12. Whereas the formation of $CoSi_2$ is satisfactory on gate structure 14, formation of $CoSi_2$ is not uniform on substrate 12 due to the presence of redeposited spacer materials. Spotty or non-uniform $CoSi_2$ does not provide the advantageous effects $CoSi_2$ layers, such as, reducing series resistance associated with the contacts.

Thus, there is a need for a method of forming spacers with reduced surface area exposed to direct sputter such that spacer material is not redeposited during sputter processes. Further, there is a need for a method of forming rectangle shaped spacers. Even further, there is a need for uniform cobalt silicon formation in integrated circuit fabrication.

SUMMARY OF THE INVENTION

One embodiment of the invention relates to a method of forming spacers in an integrated circuit. The method includes providing a gate structure over a semiconductor substrate, depositing a spacer material adjacent lateral sides of the gate structure and etching the spacer material to form spacers. The spacers have minimal surface area exposed to direct sputter.

Another embodiment of the invention relates to a method of forming rectangle shaped spacers in an integrated circuit. The method includes forming a gate structure on a substrate, depositing a spacer material over the gate structure and the substrate, polishing the spacer material off of the top of the gate structure, and etching the spacer material to form spacers. The spacers have minimal surface area exposed to direct sputter.

Another embodiment of the invention relates to an integrated circuit. The integrated circuit includes a substrate, at least one gate structure on the substrate, and spacers. The spacers abut lateral sides of the at least one gate structure and have relatively vertical sidewalls.

BRIEF DESCRIPTION OF THE DRAWINGS

Preferred exemplary embodiments are described below with reference to the accompanying drawings, wherein like reference numerals denote like elements, and.

DETAILED DESCRIPTION OF THE PREFERRED EMBODIMENTS

Figure 1:
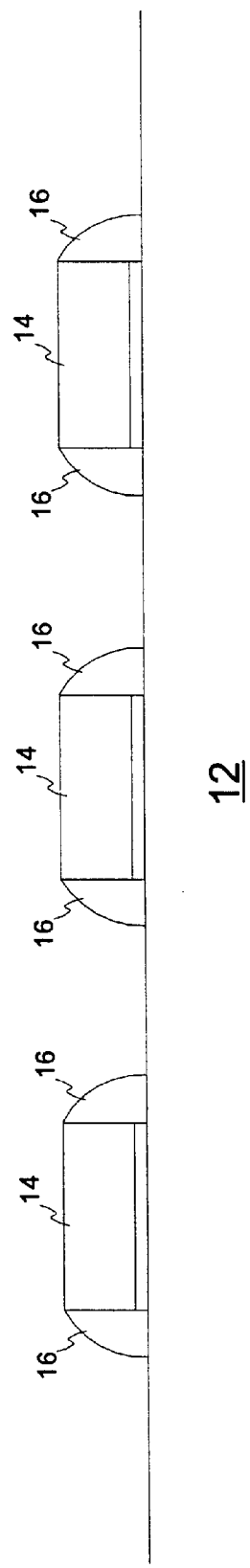
FIG. 1 is a cross-sectional view of a portion of an integrated circuit with conventional shaped spacers.
Figure 2:
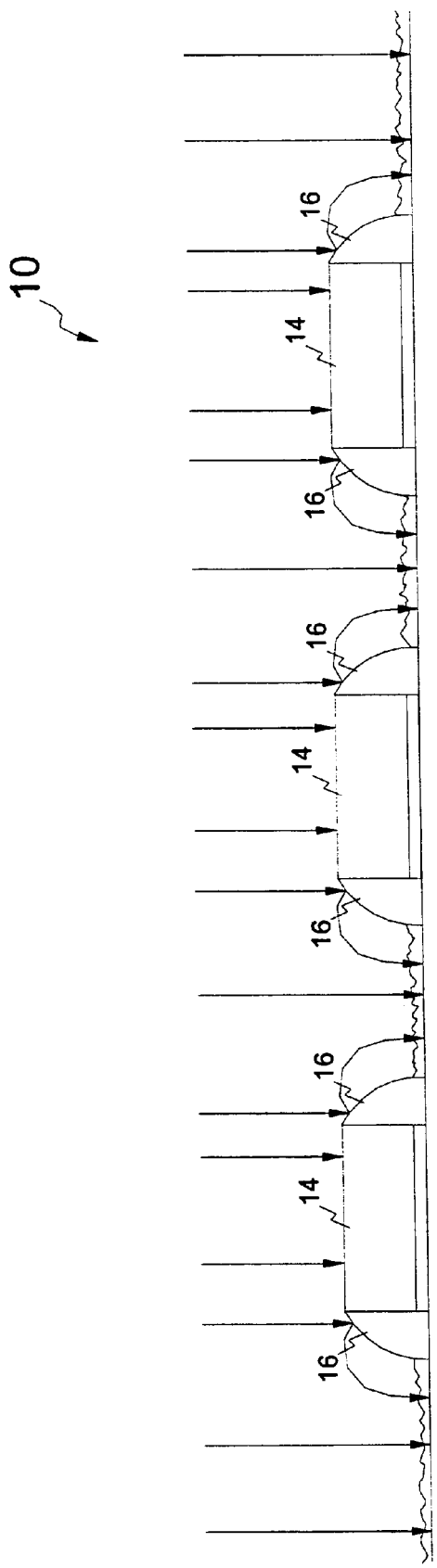
FIG. 2 is a cross-sectional view of the portion of an integrated circuit of FIG. 1, illustrating a sputtering step in the integrated circuit fabrication process.
Figure 3:
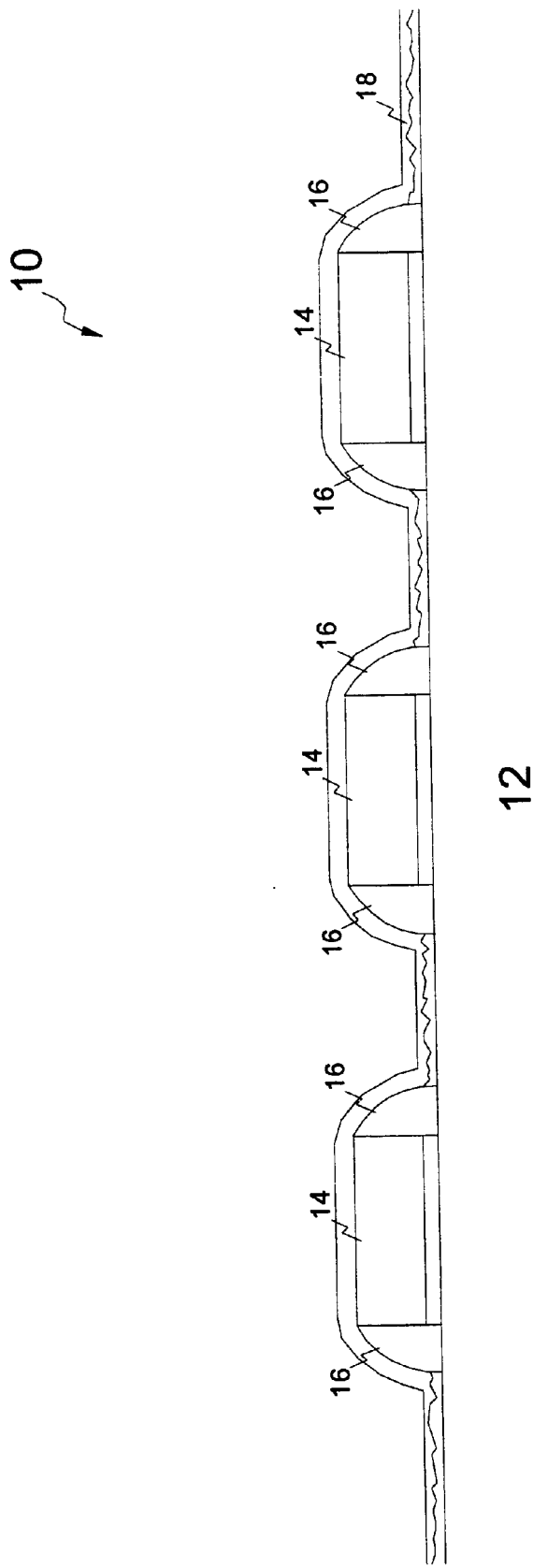
FIG. 3 is a cross-sectional view of the portion of an integrated circuit of FIG. 1, illustrating a deposition step in the integrated circuit fabrication process.
Figure 4:
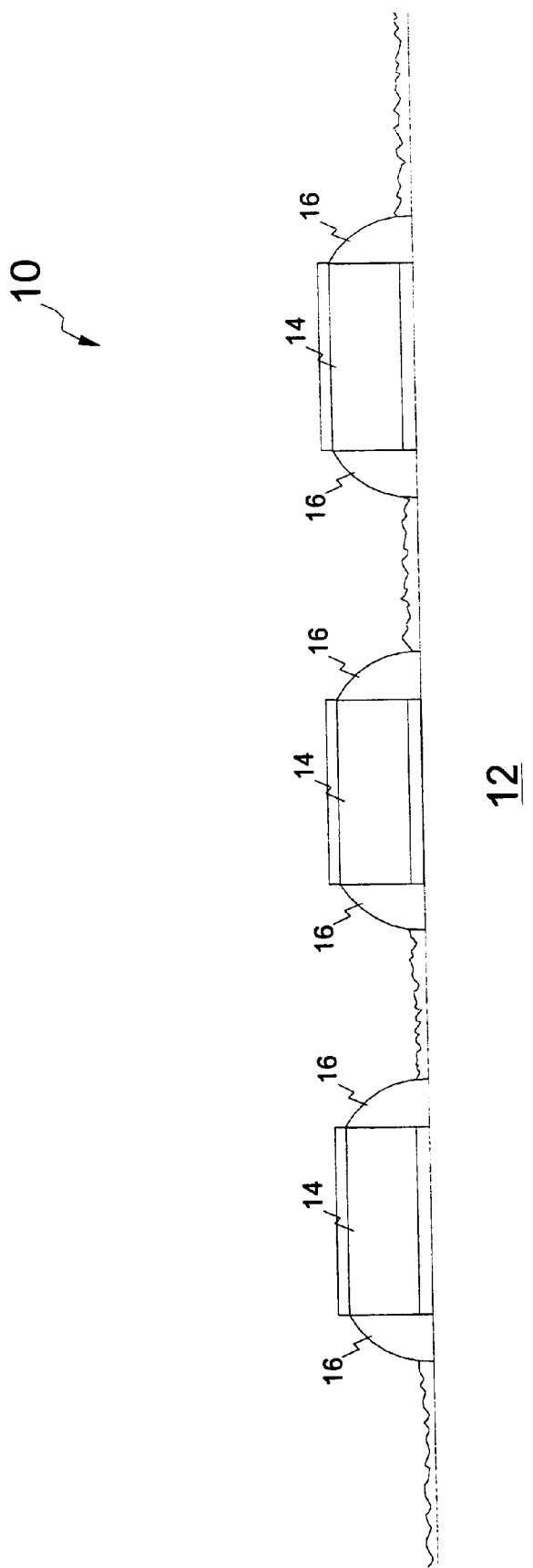
FIG. 4 is a cross-sectional view of the portion of an integrated circuit of FIG. 1, illustrating resulting spotty formation of $CoSi_2$ in the integrated circuit fabrication process.
Figure 5:
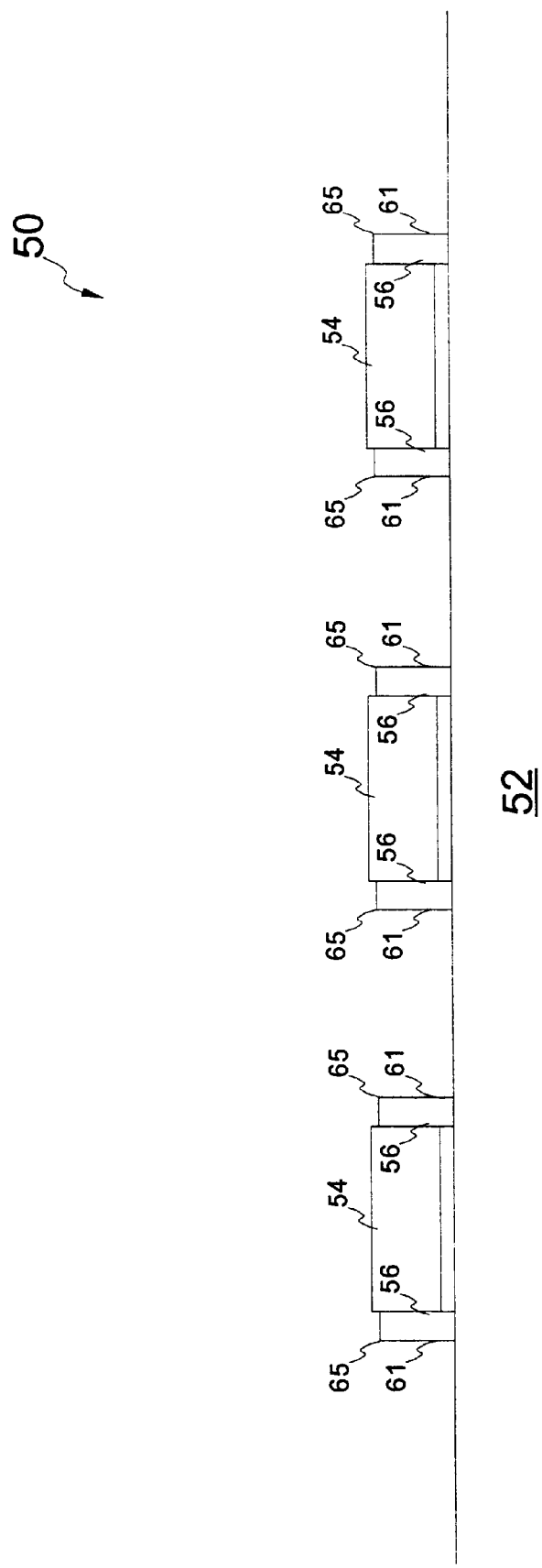
FIG. 5 is a cross-sectional view of a portion of an integrated circuit with rectangle shaped spacers in accordance with the present invention.

Referring to FIG. 5, a cross-sectional view of a portion 50 of an integrated circuit is illustrated in accordance with an exemplary embodiment of the present invention. Portion 10 includes a substrate 52, a gate structure 54, and spacers 56. Portion 10 includes several transistors, such as, metal oxide semiconductor (MOSFET) devices.

Substrate 52 is any of a variety of semiconductor materials. In an exemplary embodiment, substrate 52 is silicon. Gate structure 54 is any of a variety of conductive materials. In the exemplary embodiment, gate structure 54 is polysilicon. Gate structure 54 is aligned between active regions in substrate 52. Active regions are areas in portion 50 including impurities or dopants such as a p-type dopant (e.g., boron) or an n-type dopant (e.g., phosphorous).

Spacers 56 are preferably silicon dioxide ($SiO_2$) structures which abut lateral sides of gate structure 54. Alternatively, other spacer materials, such as, silicon nitride ($Si_3N_4$), silicon oxynitride (SiON), or other insulators can be used.

In the exemplary embodiment, spacers 56 have a rectangular cross-sectional shape. Alternatively, spacers 56 may be square shaped in cross-section or any other shape which reduces the surface area of spacers 56 which is exposed to direct sputter. The reduced surface area advantageously reduces the amount of spacer material which is redeposited on the exposed silicon surface during sputter processes. Redeposited spacer materials impede the formation of $CoSi_2$.

Spacers 56 have relatively parallel or vertical sidewalls 61. Sidewalls 61 terminate into a top surface 63 at a corner 65. Corner 65, preferably, is manufactured to be a relatively sharp corner. Corner 65 is preferably an approximately 90° corner.

Figure 6:
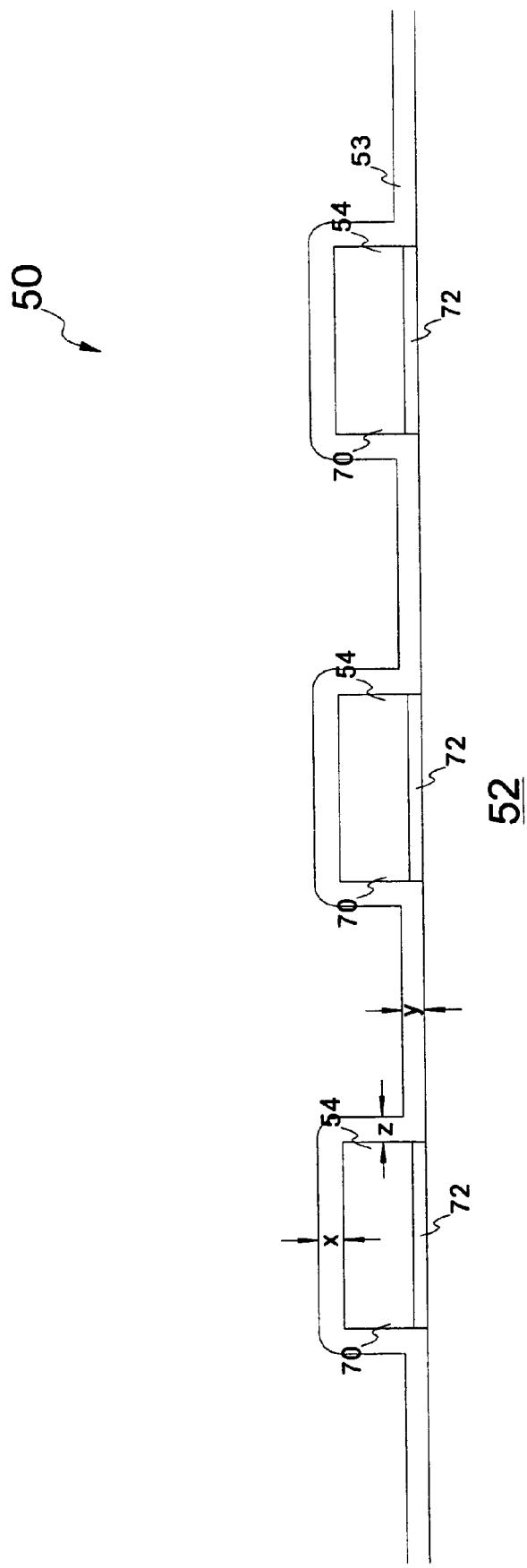
FIG. 6 is a cross-sectional view of the portion of the integrated circuit of FIG. 5, illustrating a gate formation and spacer deposition step in the method of forming rectangle shaped spacers in accordance with the present invention.

The method of forming portion 50 is described below with reference to FIGS. 5–8. The method advantageously forms portion 50 including spacers 56. In FIG. 6, a cross-sectional view of portion 50 illustrates a gate formation and spacer deposition step. Gate structure 54 is formed over substrate 52 and may, for example, be from 1000 Å–3000 Å thick (e.g. to a thickness of 2000 Å). Preferably, spacer material conformal layer 53 has a shape and thickness such that $z/x, y/x \leq 1$. Such formation of spacer material conformal layer 53 precedes formation of spacers with rectangular cross-sectional shape. Gate structure 54 can include a polysilicon conductor 70 and a gate oxide 72. Alternatively, conductor 70 can be a metal or other conductive material, and oxide 72 can be other insulative material. Spacer materials are deposited over gate structure 54 and substrate 52, forming a spacer material conformal layer 53. The spacer layer 53 can be from 500 Å–3000 Å.

Figure 7:
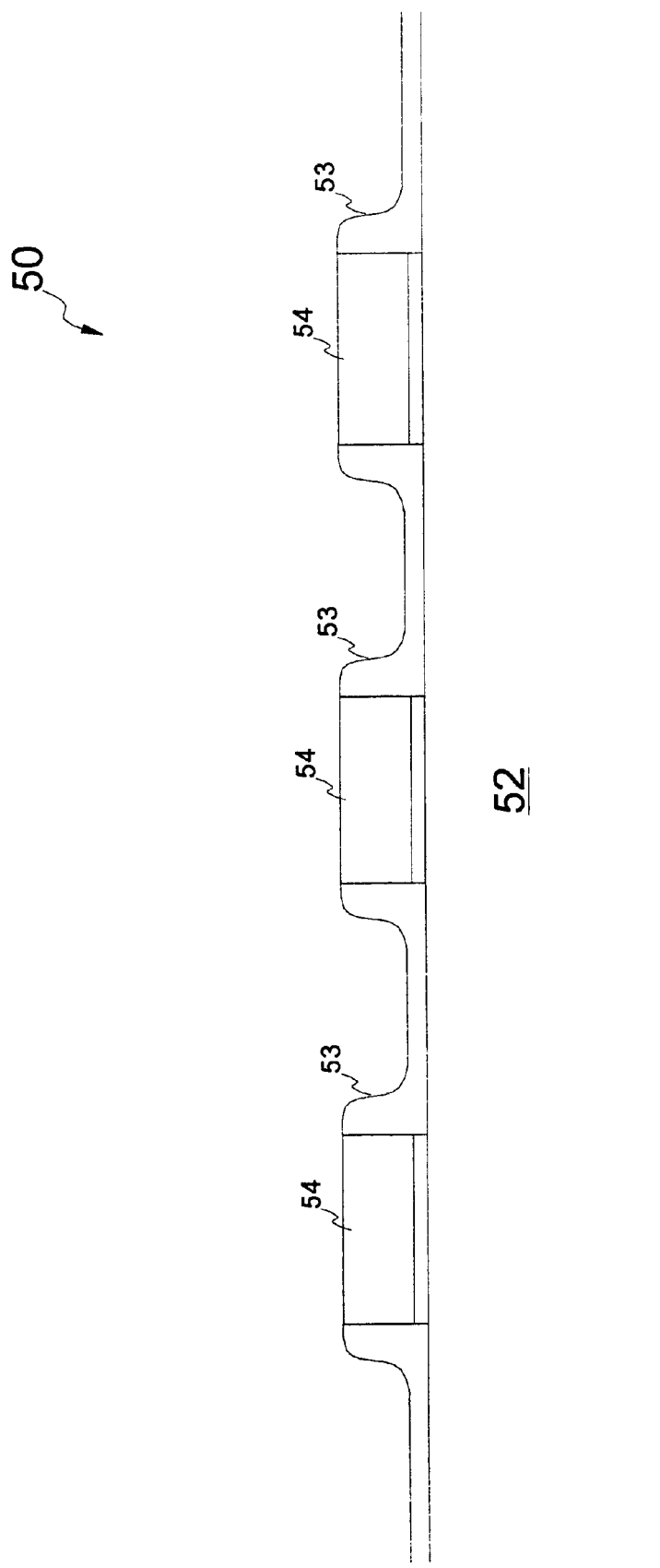
FIG. 7 is a cross-sectional view of the portion of the integrated circuit of FIG. 5, illustrating a polishing step in the method of forming rectangle shaped spacers.

In FIG. 7, a cross-sectional view of portion 50 illustrates a polishing step. During the polishing step, spacer materials are removed from the top of gate structure 54. In one embodiment, spacer material layer 53 over gate structure 54 is selectively removed by chemical-mechanical polishing (CMP) until polysilicon conductor 70 is reached. Alternatively, etching or other removal processes may be used.

After the polishing step, an anisotropic etching step is performed on the spacer material which is selective to the spacer material with respect to substrate 52 and gate structure 54. The etching step results in spacer 56 illustrated in FIG. 5. In the exemplary embodiment, spacer 56 is rectangularly shaped. Spacers 56 are preferably 2000 Å high and 1000 Å wide. Spacers 50 are preferably slightly lower in height then conductor 70 due to the etching step (e.g., 100 Å–500 Å from the top of conductor 70). On spacer material can be redeposited onto the silicon surface in between two spacers.

Figure 8:
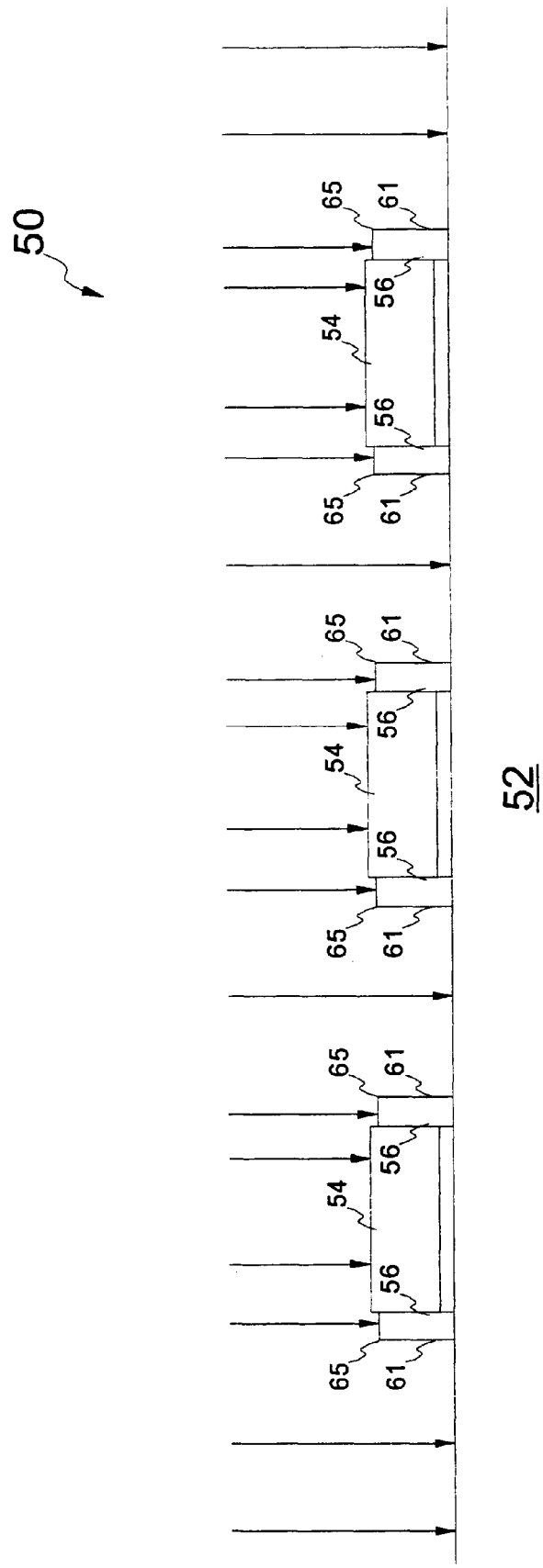
FIG. 8 is a cross-sectional view of the portion of the integrated circuit of FIG. 5, illustrating improved susceptibility to sputter deposition of rectangle shaped spacers.

In FIG. 8, a cross-sectional view of portion 50 illustrates the improved susceptibility to sputter deposition of spacers 56. Spacers 56 are less susceptible to sputter redeposition due to reduced surface area exposed to the direct sputter. Redeposited spacer material can block CoSi formation. As such, more uniform layers of $CoSi_2$ are formed by using the rectangular cross-sectional shape spacer 56. Uniform layers of $CoSi_2$ provide lower series resistance. While formation of $CoSi_2$ is discussed in the application, it should be understood that other silicide structures may be used. For example, $TiSi_2$ and $NiSi_2$ are other silicide structures.

While the embodiments illustrated in the FIGURES and described above are presently preferred, it should be understood that these embodiments are offered by way of example only. Other embodiments may include, for example, different techniques for providing spacers with reduced surface area exposed to direct sputter. The invention is not limited to a particular embodiment, but extends to various modifications, combinations, and permutations that nevertheless fall within the scope and spirit of the appended claims.

What is claimed is:

1. A method of forming an integrated circuit, the method comprising:

providing a gate structure over a semiconductor substrate;

depositing a spacer material adjacent lateral sides of the gate structure;

etching the spacer material to form rectangular spacers, the rectangular spacers having minimal surface area exposed to direct sputter; and performing sputter deposition.

2. The method of claim 1, wherein the etching the spacer material step is an anisotropic etch selective to the substrate and the gate structure.

3. The method of claim 1, wherein the rectangular spacers have a width of 1000 Angstroms.

4. The method of claim 1, wherein the rectangular spacers have a square shape.

5. The method of claim 3, further comprising polishing the spacer material to expose the top of the gate structure before the etching the spacer material step.

6. The method of claim 1, further comprising forming a layer of silicide on the substrate and the gate structures after the etching the spacer material step.

7. The method of claim 6, wherein the forming a layer of silicide comprises depositing a layer of cobalt over the gate structure and the substrate with minimal redeposition of spacer material from the spacers.

8. The method of claim 1, wherein the spacer material is an oxide material.

9. A method of forming an integrated circuit having rectangular cross-sectionally shaped spacers, the method comprising:

forming a gate structure on a substrate;

depositing a spacer material over the gate structure and the substrate;

polishing the spacer material off of the top of the gate structure; and etching the spacer material to form rectangular spacers, the rectangular spacers having minimal surface area exposed to direct sputter; and performing sputter deposition.

10. The method of claim 9, wherein the rectangular spacers have a width of 1000 Angstroms.

11. The method of claim 10, wherein the rectangular spacers have a square shape.

12. The method of claim 9, further comprising forming a layer of silicide on the substrate and the gate structures.

13. The method of claim 12, wherein the forming a layer of silicide comprises depositing a layer of cobalt over the gate structure and the substrate with minimal redeposition of spacer meterial from spacers.

14. The method of claim 12, wherein the suicide is titanium suicide (TiSi$_2$).

15. A method of forming an integrated circuit, the method comprising:

depositing a spacer material adjacent lateral sides of a gate stack;

etching the spacer material to form rectangular spacers, the rectangular spacers having minimal surface area exposed to direct sputter; and performing sputter deposition.

16. The method of claim 15, wherein the etching the spacer material step is an anisotropic etch selective to the substrate and the gate stack.

17. The method of claim 15, wherein the rectangular spacers include a cross-sectional width of 1000 Angstroms.

18. The method of claim 17, wherein the rectangular spacers have a square shape.

19. The method of claim 17, further comprising polishing the spacer material to expose the top of the gate stack before the etching the spacer material step.

20. The method of claim 15, further comprising forming a layer of silicide on the gate stack after the etching the spacer material step.

* * * * *

UNITED STATES PATENT AND TRADEMARK OFFICE
CERTIFICATE OF CORRECTION

PATENT NO. : 6,265,273 B1
DATED : July 24, 2001
INVENTOR(S) : Steven C. Avanzino; Stephen Keetai Park; Bharath Rangarajan; Jeffrey A. Shields; Larry Yu Want; Guarionex Morales It is certified that error appears in the above-identified patent and that said Letters Patent is hereby corrected as shown below:

<u>Column 5, claim 13,</u>
Line 23, replace "meterial" with -- material --.

<u>Column 5, claim 14,</u>
Line 24, replace "suicide" with -- silicide --.
Line 25, replace "suicide" with -- silicide --.

Signed and Sealed this

Twenty-sixth Day of February, 2002

Attest:

JAMES E. ROGAN
*Attesting Officer*   *Director of the United States Patent and Trademark Office*